（12）United States Patent
Lin et al.

(10) Patent No.: US 11,929,111 B2
(45) Date of Patent: Mar. 12, 2024

(54) SENSE AMPLIFIER, MEMORY AND METHOD FOR CONTROLLING SENSE AMPLIFIER

(71) Applicants: ANHUI UNIVERSITY, Anhui (CN); CHANGXIN MEMORY TECHNOLOGIES, INC, Hefei (CN)

(72) Inventors: Zhiting Lin, Hefei (CN); Guanglei Wen, Hefei (CN); Jun He, Hefei (CN); Zhan Ying, Hefei (CN); Xin Li, Hefei (CN); Kanyu Cao, Hefei (CN); Wenjuan Lu, Hefei (CN); Chunyu Peng, Hefei (CN); Xiulong Wu, Hefei (CN); Junning Chen, Hefei (CN)

(73) Assignees: ANHUI UNIVERSITY, Hefei (CN); CHANGXIN MEMORY TECHNOLOGIES, INC., Hefei (CN)

( * ) Notice: Subject to any disclaimer, the term of this patent is extended or adjusted under 35 U.S.C. 154(b) by 234 days.

(21) Appl. No.: 17/472,157

(22) Filed: Sep. 10, 2021

(65) Prior Publication Data
US 2022/0068357 A1 Mar. 3, 2022

Related U.S. Application Data

(63) Continuation of application No. PCT/CN2020/139653, filed on Dec. 25, 2020.

(30) Foreign Application Priority Data

Sep. 1, 2020 (CN) .......................... 202010902476.X

(51) Int. Cl.
G11C 5/06 (2006.01)
G11C 11/4074 (2006.01)
(Continued)

(52) U.S. Cl.
CPC ............ *G11C 11/4091* (2013.01); *G11C 5/06* (2013.01); *G11C 11/4074* (2013.01); *G11C 11/4094* (2013.01)

(58) Field of Classification Search
CPC ... G11C 11/4091; G11C 5/06; G11C 11/4074; G11C 11/4094; G11C 7/065; G11C 7/12; G11C 11/4076
(Continued)

(56) References Cited

U.S. PATENT DOCUMENTS 5,537,066 A 7/1996 Kawashima
5,764,103 A * 6/1998 Burra ...................... H03F 1/303
330/9

(Continued)

FOREIGN PATENT DOCUMENTS

CN 1841566 A * 10/2006 ............. G11C 11/16
CN 101540188 A 9/2009
(Continued)

OTHER PUBLICATIONS

Huang, Pei, Offset-Compensation High-Performance Sense Amplifier for Low-Voltage DRAM Based on Current Mirror and Switching Point, 2022, IEEE, All pages. (Year: 2022).*
(Continued)

*Primary Examiner* — Michael T Tran
(74) *Attorney, Agent, or Firm* — Cooper Legal Group, LLC

(57) ABSTRACT

A sense amplifier, a memory and a method for controlling the sense amplifier are provided. The sense amplifier includes: an amplification module, arranged to read data in a memory cell; and a control module, electrically connected to the amplification module. In a first offset compensation stage of the sense amplifier, the control module is arranged to configure the amplification module to include a first
(Continued)

inverter and a second inverter, and each of the first inverter and the second inverter is an inverter an input terminal and an output terminal connected to each other; and in a second offset compensation stage of the sense amplifier, the control module is arranged to configure the amplification module to include a current mirror structure.

18 Claims, 16 Drawing Sheets

(51) Int. Cl.
  *G11C 11/4091* (2006.01)
  *G11C 11/4094* (2006.01)
(58) Field of Classification Search
  USPC .................................... 365/185.21, 205
  See application file for complete search history.

(56) References Cited

U.S. PATENT DOCUMENTS

| | | | | |
|---|---|---|---|---|
| 5,990,737 | A * | 11/1999 | Czarnul | H03F 3/45475 330/69 |
| 6,225,834 | B1 | 5/2001 | Gang | |
| 6,529,421 | B1 | 3/2003 | Marr | |
| 7,167,049 | B2 | 1/2007 | Lim | |
| 8,072,200 | B1 * | 12/2011 | Qiu | H02M 3/1584 323/907 |
| 8,416,602 | B2 | 4/2013 | Kitagawa | |
| 9,418,714 | B2 * | 8/2016 | Sinangil | G11C 29/028 |
| 9,553,550 | B2 * | 1/2017 | Puliafico | H03F 3/195 |
| 9,698,765 | B1 | 7/2017 | La Rosa | |
| 10,741,232 | B1 | 8/2020 | Jabeur | |
| 10,783,969 | B2 | 9/2020 | Sheng et al. | |
| 11,315,610 | B1 * | 4/2022 | Peng | G11C 7/065 |
| 11,423,956 | B2 * | 8/2022 | Shang | G11C 11/419 |
| 2004/0027892 | A1 | 2/2004 | Sim | |
| 2004/0218446 | A1 * | 11/2004 | Gogl | G11C 7/062 365/205 |
| 2006/0044903 | A1 | 3/2006 | Forbes | |
| 2007/0024325 | A1 | 2/2007 | Chen | |
| 2008/0165602 | A1 | 7/2008 | Sutardja | |
| 2009/0058512 | A1 * | 3/2009 | Huang | G05F 3/30 327/539 |
| 2009/0238582 | A1 * | 9/2009 | Tsunoda | H04B 10/6911 398/208 |
| 2010/0157672 | A1 * | 6/2010 | Barkley | G11C 16/30 365/185.21 |
| 2010/0157698 | A1 | 6/2010 | Barth, Jr. | |
| 2010/0182860 | A1 | 7/2010 | Chang | |
| 2011/0110174 | A1 | 5/2011 | Cho | |
| 2011/0148389 | A1 * | 6/2011 | Bohannon | G05F 3/30 323/313 |
| 2012/0235708 | A1 * | 9/2012 | Slamowitz | G11C 7/062 327/53 |
| 2013/0201761 | A1 * | 8/2013 | Kim | G11C 11/56 365/185.21 |
| 2013/0314977 | A1 | 11/2013 | Wang | |
| 2013/0322154 | A1 | 12/2013 | Youn | |
| 2015/0008841 | A1 | 1/2015 | Wu | |
| 2015/0016183 | A1 * | 1/2015 | Sinangil | G11C 7/065 365/205 |
| 2015/0187394 | A1 * | 7/2015 | Lee | G11C 7/065 365/207 |
| 2015/0194209 | A1 | 7/2015 | Wu | |
| 2015/0243350 | A1 * | 8/2015 | Chen | G11C 7/062 365/154 |
| 2016/0203856 | A1 * | 7/2016 | Sachdev | G11C 11/419 365/154 |
| 2016/0266175 | A1 * | 9/2016 | Nizza | G01R 19/0092 |
| 2018/0336952 | A1 * | 11/2018 | Miyazaki | G11C 16/3459 |
| 2019/0007000 | A1 | 1/2019 | Jeong | |
| 2019/0279717 | A1 | 9/2019 | Sheng et al. | |
| 2019/0325946 | A1 * | 10/2019 | Lu | H10B 10/00 |
| 2019/0384337 | A1 * | 12/2019 | Lu | G05F 1/575 |
| 2020/0105315 | A1 | 4/2020 | Chang | |
| 2020/0126615 | A1 | 4/2020 | Lei | |
| 2020/0314374 | A1 * | 10/2020 | Yang | H04N 25/76 |
| 2022/0270653 | A1 * | 8/2022 | Cao | G11C 7/08 |
| 2022/0320076 | A1 * | 10/2022 | Li | H02H 9/046 |

FOREIGN PATENT DOCUMENTS

| | | | | |
|---|---|---|---|---|
| CN | 102148051 | A | 8/2011 | |
| CN | 102290086 | A | 12/2011 | |
| CN | 101635509 | B * | 3/2012 | ............ H02M 3/156 |
| CN | 102385900 | A | 3/2012 | |
| CN | 102385901 | A | 3/2012 | |
| CN | 102394094 | A | 3/2012 | |
| CN | 102420005 | A | 4/2012 | |
| CN | 102592650 | A | 7/2012 | |
| CN | 102612715 | A | 7/2012 | |
| CN | 202549301 | U | 11/2012 | |
| CN | 102831921 | A | 12/2012 | |
| CN | 103745743 | A | 4/2014 | |
| CN | 105895139 | A | 8/2016 | |
| CN | 106328182 | A | 1/2017 | |
| CN | 106486143 | A | 3/2017 | |
| CN | 106782652 | A | 5/2017 | |
| CN | 107464581 | A | 12/2017 | |
| CN | 108231100 | A | 6/2018 | |
| CN | 108492840 | A | 9/2018 | |
| CN | 109448768 | A | 3/2019 | |
| CN | 109686387 | A | 4/2019 | |
| CN | 109994140 | A | 7/2019 | |
| CN | 210575115 | U | 5/2020 | |
| CN | 210606637 | U | 5/2020 | |
| CN | 111313848 | A | 6/2020 | |
| CN | 111383674 | A | 7/2020 | |
| CN | 111863054 | A | 10/2020 | |
| CN | 111863055 | A | 10/2020 | |
| CN | 111933194 | A | 11/2020 | |
| CN | 111933195 | A | 11/2020 | |
| EP | 2442311 | A1 | 4/2012 | |
| KR | 2000039961 | A * | 7/2000 | ......... G11C 11/4091 |
| TW | 201248645 | A * | 12/2012 | ............. G11C 16/06 |
| WO | WO-2021101709 | A1 * | 5/2021 | ......... G11C 11/4074 |

OTHER PUBLICATIONS

International Search Report in the international application No. PCT/CN2020/139653, dated May 26, 2021. 2 pages.
English translation of the Written Opinion of the International Search Authority in the international application No. PCT/CN2020/139653, dated May 26, 2021. 4 pages.
"Charge Sensitive Amplifier With Offset-Compensated V-to-I Converter for the Mini-SDD-Based DSSC Detector", May 2021, A Grande, C. Fiorini, G. Utica, F. Erdinger, P. Fischer and M. Porro; IEEE Transactions on Nuclear Science, vol. 66, No. 10, 7 pages.
Inyong Kwon, etc, "Experimental Validation of Charge-Sensitive Amplifier Configuration that Compensates for Detector Capacitance", IEEE Transactions on Nuclear Science, vol. 63, No. 2, Apr. 20, 2016. p. 1202-1208. 7 pages.
"Design of Current-mirror Compensation Circuit for Multi-row Read in In-SRAM Computing", Fang Yaqi, China Excellent Master's Degree Thesis Full Text Database & Information Science and Technology Series, vol. 2020, No. 7, 20200715. 64 pages with English abstract.
"A 4T Dual Replica-Bitline Delay Technique Forprocess-Variation-Tolerant Low Voltage SRAM Sense Amplifier Timing", Mar. 2015, Ye Ya-Dong, Wu Xiu-Long and Lin Zhi-Ting, Microelectronics & Computer, vol. 32, No. 3, 015. 4 pages with English abstract.
First Office Action of the Chinese application No. 202010902476.X, dated May 19, 2022. 13 pages with English translation.
Notice of Allowance of the Chinese application No. 202010902476. X, dated Aug. 4, 2022. 6 pages with English translation.
International Search Report in the international application No. PCT/CN2020/139627, dated May 17, 2021. 2 pages.

(56) References Cited

OTHER PUBLICATIONS

English translation of the Written Opinion of the International Search Authority in the international application No. PCT/CN2020/139627, dated May 17, 2021. 4 pages.
"Sensing Voltage Compensation Circuit for Low-Power DRAM Bit-Line Sense Amplifier" 2018, Suk Min Kim Tae Woo Oh and Seong-Ook Jung, 2018 International Conference on Electronics, Information, and Communication (ICEIC), 4 pages.
"A ZQ Calibration Method in DDR3 Dram", Wang Xiao-Guang, Wang Song, Tan Jie and Li Jin; China Integrated Circuit, Issue 07, 4 pages with English abstract.
First Office Action of the Chinese application No. 202010811719.9, dated Mar. 22, 2022. 7 pages with English abstract.
First Office Action of the U.S. Appl. No. 17/474,172, dated Jul. 27, 2023. 25 pages.
International Search Report in the international application No. PCT/CN2020/139652, dated May 31, 2021. 2 pages.
English translation of the Written Opinion of the International Search Authority in the international application No. PCT/CN2020/139652, dated May 31, 2021. 4 pages.
"Novel Current-Mirror Based Time Dependent Sense Scheme for MLC PRAM", 2019, Jun-Tae Choi, Jun-Young Kweon Yunheub Song and Tony Tae-Hyoung Kim, International Conference on Electronics, Information, and Communication (ICEIC), 3 pages.
"Design of a Low-voltage High-speed Sense Amplifier Circuit", Jun. 2016, Yang Guangjun, Research & Progress of Sse, vol. 36, No. 3, 5 pages with English abstract.
"Design of a High Speed Sense Amplifier Circuit", Jun. 2015, Xhang Hua, Microelectronic vol. 45, No. 3, 5 pages with English abstract.

First Office Action of the Chinese application No. 202010902453.9, dated May 19, 2022. 8 pages with English abstract.
Notice of Allowance of the Chinese application No. 202010902453.9, dated Aug. 4, 2022. 6 pages with English translation.
First Office Action of the U.S. Appl. No. 17/474,166, dated Jul. 28, 2023. 22 pages.
International Search Report in the international application No. PCT/CN2020/139373 , dated May 12, 2021. 2 pages.
English translation of the Written Opinion of the International Search Authority in the international application No. PCT/CN2020/139373 , dated May 12, 2021. 4 pages.
"Design of High-speed High-reliability Voltage Mode Sense Amplifier", 2010, Wang Ti Ran Yu Zong and Jia Ze, Computer Technology and Its Applications vol. 2010, No. 5, 5 pages with English abstract.
"Offset-Canceling Current-Sampling Sense Amplifier for Resistive Nonvolatile Memory in 65 nm CMOS", Tachui Na, Byungkyu Song, Jung Pill Kim, Seung H. Kang and Seong-Ook Jung, IEEE Journal of Solid-State Circuits, vol. 52, Issue 2, 9 pages.
"The Analysis and Design Based on 65nm SRAM for Low-Offset-Voltage and Self-Activated Sense Amplifier", May 2017, Zhou Yongliang, China Excellent Master's Dissertation Full Text Database & Information Science and Technology Series, vol. 8, 69 pages with English abstract.
First Office Action of the Chinese application No. 202010811687.2, dated May 19, 2022. 12 pages with English translation.
Notice of Allowance of the Chinese application No. 202010811687.2, dated Aug. 4, 2022. 6 pages with English translation.
First Office Action of the U.S. Appl. No. 17/441,679 dated Feb. 17, 2022, 16 pages.

* cited by examiner

SENSE AMPLIFIER, MEMORY AND METHOD FOR CONTROLLING SENSE AMPLIFIER

CROSS-REFERENCE TO RELATED APPLICATION

The present application is a continuation of International Application No. PCT/CN2020/139653, filed on Dec. 25, 2020, which claims priority to Chinese Patent Application No. 202010902476.X, filed on Sep. 1, 2020 and entitled "SENSE AMPLIFIER, MEMORY AND METHOD FOR CONTROLLING SENSE AMPLIFIER". The contents of International Application No. PCT/CN2020/139653 and Chinese Patent Application No. 202010902476.X are hereby incorporated by reference in their entireties.

BACKGROUND

With the popularization of electronic devices such as mobile phones, tablet computers and personal computers, semiconductor memory technologies are also developed quickly. For example, memories such as the Dynamic Random Access Memory (DRAM) and Static Random-Access Memory (SRAM), which have the advantages of high density, low power consumption, low price and the like, have been widely applied to various electronic devices.

In the DRAM, bitlines in different memory cell arrays are connected in pairs to a sense amplifier that is provided with a bitline BL (reading bitline) input terminal and a bitline BLB (reference bitline) input terminal. In the read operation (or the refresh operation), the functions of the sense amplifier are to read a voltage difference between the reading bitline BL and the reference bitline BLB, and amplifies the voltage difference between these two bitlines.

The sense amplifier includes a Metal-Oxide-Semiconductor Field Effect Transistor (MOSFET). However, in the semiconductor technologies, due to changes in process and temperature, two MOSFETs that are same theoretically may be mismatched, that is, the two MOSFETs that are same theoretically may have different characteristics, such that the sense amplifier produces offset noise which seriously affects the performance of the semiconductor memory.

It is to be noted that the above information disclosed in the Background section is merely for enhancement of the understanding on the background of the present disclosure and therefore it may contain information which does not constitute related art that is already known to a person of ordinary skill in the art.

SUMMARY

The present disclosure relates to the technical field of semiconductor memories, and provides a sense amplifier, a memory and a method for controlling the sense amplifier.

According to a first aspect of the present disclosure, there is provided a sense amplifier, which may include: an amplification circuit, arranged to read data in a memory cell; and a control circuit, electrically connected to the amplification circuit. In a first offset compensation stage of the sense amplifier, the control circuit may be arranged to configure the amplification circuit to include a first inverter and a second inverter, herein, each of the first inverter and the second inverter is an inverter with an input terminal and an output terminal connected to each other. In a second offset compensation stage of the sense amplifier, the control circuit may be arranged to configure the amplification circuit to include a current mirror structure.

According to a second aspect of the present disclosure, there is provided a memory, which may include a sense amplifier. The sense amplifier may include an amplification circuit, arranged to read data in a memory cell; and a control circuit, electrically connected to the amplification circuit. In a first offset compensation stage of the sense amplifier, the control circuit may be arranged to configure the amplification circuit to comprise a first inverter and a second inverter, each of the first inverter and the second inverter being an inverter with an input terminal and an output terminal connected to each other. In a second offset compensation stage of the sense amplifier, the control circuit may be arranged to configure the amplification circuit to comprise a current mirror structure.

According to a third aspect of the present disclosure, there is provided a method for controlling a sense amplifier. The sense amplifier may include an amplification circuit and a control circuit. The method for controlling the sense amplifier may include that: in a first offset compensation stage of the sense amplifier, the control circuit may configure the amplification circuit to include a first inverter and a second inverter, herein, each of the first inverter and the second inverter is an inverter with an input terminal and an output terminal connected to each other; and in a second offset compensation stage of the sense amplifier, the control circuit may configure the amplification circuit to include a current mirror structure.

It is to be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments conforming to the present disclosure and, together with the description, serve to explain the principles of the present disclosure. It is apparent that the accompanying drawings in the description below show merely some of the embodiments of the present disclosure, and persons of ordinary skill in the art may still derive other drawings from these accompanying drawings without creative efforts, in which.

DETAILED DESCRIPTION

Figure 1:
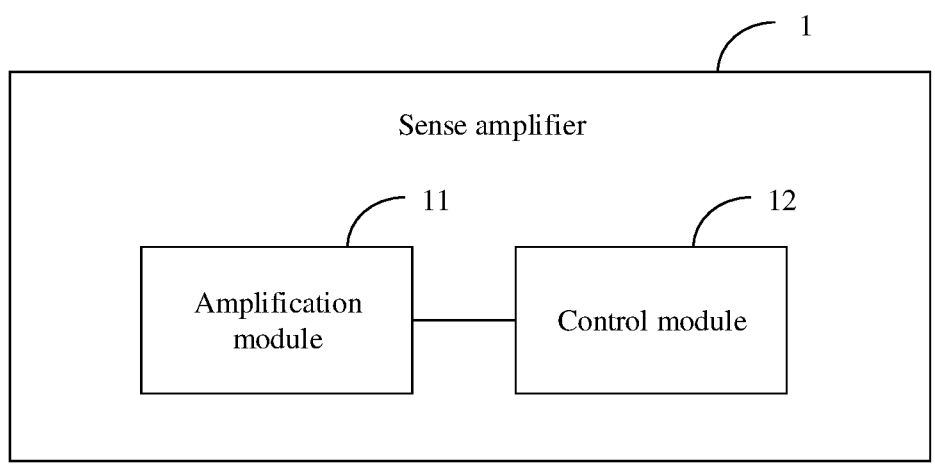
FIG. 1 schematically illustrates a block diagram of a sense amplifier according to an exemplary embodiment of the present disclosure.

Exemplary embodiments will now be described more fully with reference to the accompanying drawings. However, the exemplary embodiments may be implemented in various forms and should not be understood as being limited to the examples set forth herein. Rather, these embodiments are provided to make the present disclosure more thorough and complete, and to fully convey the concepts of the example embodiments to those skilled in the art. The features, structures or characteristics described herein may be combined in one or more embodiments in any suitable manner. In the following description, numerous specific details are provided to give a thorough understanding on the embodiments of the present disclosure. However, it will be recognized by those skilled in the art that the technical solution of the present disclosure may be practiced without one or more of the specific details, or that other methods, components, devices, steps, or the like may be adopted. In other instances, well-known technical solutions are not illustrated or described in detail to avoid obscuring aspects of the present disclosure.

In addition, the drawings are merely schematic representations of the present disclosure and are not necessarily drawn to scale. The same reference numerals in the drawings denote the same or similar parts, and repetitive description thereof will be omitted. The descriptions on "first", "second", "third", "fourth", "fifth", "sixth", "seventh" and "eighth" are merely for distinguishing from one another and should not be taken as limits to the present disclosure.

It is to be noted that the terms "connected" in the present disclosure may include a direct connection and an indirect connection. In the direct connection, no component is present between ends. For example, a first terminal of a switch A is connected to a first terminal of a switch B, which may be that only a connection wire (such as a metal wire) is present on a connection line between the first terminal of the switch A and the first terminal of the switch B, while other components are not present. In the indirect connection, other components may be present between ends. For example, a first terminal of a switch C is connected to a first terminal of a switch D, which may be that at least one other component (such as a switch E), except for a connection wire, is further present on the connection line between the first terminal of the switch C and the first terminal of the switch D.

In the sense amplifier, due to the difference of the manufacture procedure and the influence of the working environment, transistors may vary in size, migration rate, threshold voltage and the like. The transistors are typically impossible to be the same completely in performance, which results in the offset of the sense amplifier, which is equivalent to the occurrence of offset noise, thereby seriously affecting the correctness of the data read by the memory.

For example, the sense amplifier includes two NMOS transistors symmetrically arranged to one another. In an ideal state, it is expected that these two NMOS transistors are completely the same in performance. However, in practice, the threshold voltages of these two NMOS transistors may be different from each other, which cause the offset of the circuit. For this case, if no measures are taken, in a case of reading data from the memory cell, the original stored "1" may be read and output as "0" wrongly, or the originally stored "0" is read and output as "1" wrongly.

In view of this, the present disclosure provides a novel sense amplifier.

FIG. 1 schematically illustrates a block diagram of a sense amplifier according to an exemplary embodiment of the present disclosure. As illustrated in FIG. 1, the sense amplifier 1 may include an amplification module 11 and a control module 12.

The amplification module 11 may be arranged to read data in a memory cell on a first bitline or a second bitline.

The control module 12 is electrically connected to the amplification module 11.

In a first offset compensation stage of the sense amplifier, the control module 12 is arranged to configure the amplification module 11 to include a first inverter and a second inverter, herein, each of the first inverter and the second inverter is an inverter with an input terminal and an output terminal connected to each other.

In a second offset compensation stage of the sense amplifier, the control module 12 is arranged to configure the amplification module 11 to include a current mirror structure.

Based on the circuit configuration of the present disclosure, voltages of bitlines on two sides of the sense amplifier may be adjusted to compensate the influence on the voltages of the bitlines on the two sides of the sense amplifier due to the offset noise, thereby improving the performance of the semiconductor memory.

It is to be understood that the offset noise in the present disclosure refers to a voltage difference produced by inconsistency between at least two transistors (or components) in the amplification module 11. In a case of integrating voltage differences between all transistors (or components), the offset noise refers to the offset noise of the whole amplification module 11.

The amplification module 11 may include a first PMOS transistor (hereinafter referred to as a transistor P1), a second PMOS transistor (hereinafter referred to as a transistor P2), a first NMOS transistor (hereinafter referred to as a transistor N1), and a second NMOS transistor (hereinafter referred to as a transistor N2).

In this case, the offset noise may be an offset voltage between the transistor P1 and the transistor P2, or the offset noise may be an offset voltage between the transistor N1 and the transistor N2, or the offset noise may be an offset voltage after the above two kinds of offset voltages are integrated, which is not limited by the present disclosure.

Figure 2:
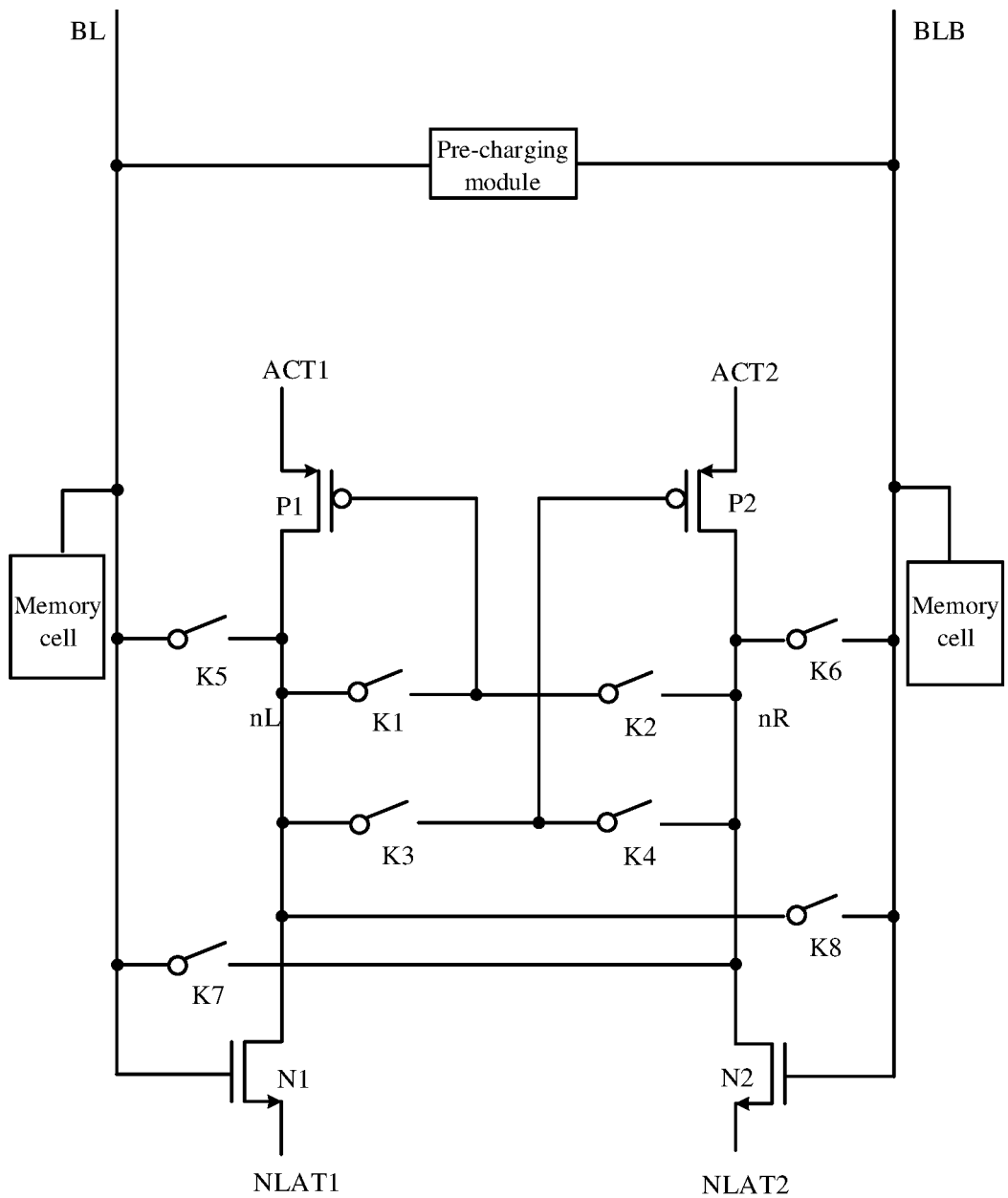
FIG. 2 schematically illustrates a circuit diagram of a sense amplifier according to an exemplary embodiment of the present disclosure.

FIG. 2 schematically illustrates a circuit diagram of a sense amplifier according to an exemplary embodiment of the present disclosure.

Referring to FIG. 2, a drain of the transistor P1 is connected to a drain of the transistor N1, and a drain of the transistor P2 is connected to a drain of the transistor N2. In addition, a gate of the transistor N1 is connected to the first bitline BL and a gate of the transistor N2 is connected to the second bitline BLB.

For the ease of subsequent description, a first node nL and a second node nR may be defined in the sense amplifier. The drain of the transistor P1 and the drain of the transistor N1 are connected to the first node nL, and the drain of the transistor P2 and the drain of the transistor N2 are connected to the second node nR.

The working stage of the sense amplifier in the exemplary embodiment of the present disclosure may be at least divided into: a first offset compensation stage, a second offset compensation stage, a first amplification stage and a second amplification stage.

In the first offset compensation stage of the sense amplifier, the transistor P1 and the transistor N1 are configured as the first inverter, and the transistor P2 and the transistor N2 are configured as the second inverter.

The exemplary embodiment of the present disclosure implements the above configuration through the control module. Referring to FIG. 2, the control module may include a first switch (hereinafter referred to as a switch K1), a second switch (hereinafter referred to as a switch K2), a third switch (hereinafter referred to as a switch K3), a fourth switch (hereinafter referred to as a switch K4), a fifth switch (hereinafter referred to as a switch K5) and a sixth switch (hereinafter referred to as a switch K6).

A first terminal of the switch K1 is connected to the first node nL, and a second terminal of the switch K1 is connected to a gate of the transistor P1; a first terminal of the switch K2 is connected to the gate of the transistor P1, and a second terminal of the switch K2 is connected to the second node nR; a first terminal of the switch K3 is connected to a gate of the transistor P2, and a second terminal of the switch K3 is connected to the first node nL; a first terminal of the switch K4 is connected to the second node nR, and a second terminal of the switch K4 is connected to the gate of the transistor P2; a first terminal of the switch K5 is connected to the first bitline BL, and a second terminal of the switch K5 is connected to the first node nL; and a first terminal of the sixth switch K6 is connected to the second bitline BLB, and a second terminal of the sixth switch K6 is connected to the second node nR.

In the first offset compensation stage of the sense amplifier, the switch K1, the switch K4, the switch K5 and the switch K6 are turned on, and the switch K2 and the switch K3 are turned off.

Types of the switch K1, the switch K2, the switch K3, the switch K4 and the switch K5 are not limited by the present disclosure. For example, the switch K1 may be the PMOS transistor, NMOS transistor or Complementary Metal-Oxide-Semiconductor Transistor (CMOS) transmission gate; the switch K2 may be the PMOS transistor, NMOS transistor or CMOS transmission gate; the switch K3 may be the PMOS transistor, NMOS transistor or CMOS transmission gate; the switch K4 may be the PMOS transistor, NMOS transistor or CMOS transmission gate; the switch K5 may be the PMOS transistor, NMOS transistor or CMOS transmission gate; and the switch K6 may be the PMOS transistor, NMOS transistor or CMOS transmission gate.

In some embodiments of the present disclosure, the switch K1 may include a control terminal, configured to control an on-off state of the switch K1 in response to a first control signal (recorded as a control signal CONAZ); and the switch K2 may also include a control terminal, configured to control an on-off state of the switch K2 in response to the control signal CONAZ. That is, the control terminal of each of the switch K1 and the switch K2 may receive the control signal CONAZ. However, it is to be understood that the switch K1 may also be different from the switch K2 in control signal, which is related with the types of the switch K1 and the switch K2, and is not limited by the present disclosure.

The switch K3 may include a control terminal, configured to control an on-off state of the switch K3 in response to a second control signal (recorded as a control signal CONAZ1); and the switch K4 may also include a control terminal, configured to control an on-off state of the switch K4 in response to the control signal CONAZ1. That is, the control terminal of each of the switch K3 and the switch K4 may receive the control signal CONAZ1. However, it is to be understood that the switch K3 may also be different from the switch K4 in control signal, which is related with the types of the switch K3 and the switch K4, and is not limited by the present disclosure.

The switch K5 may include a control terminal, configured to control an on-off state of the switch K5 in response to a third control signal (recorded as a control signal CONCZ1); and the switch K6 may also include a control terminal, configured to control an on-off state of the switch K6 in response to a fourth control signal (recorded as a control signal CONCZ).

In addition, a source of the transistor P1 may receive a fourth control signal (recorded as a control signal ACT1), a source of the transistor P2 may receive a fifth control signal (recorded as a control signal ACT2), a source of the transistor N1 may receive a sixth control signal (recorded as a control signal NLAT1), and a source of the transistor N2 may receive a seventh control signal (recorded as a control signal NLAT2).

In the first offset compensation stage of the sense amplifier, the source of each of the transistor P1 and the transistor P2 is connected to a first voltage. The first voltage may be a power voltage VCC. That is, during this stage, both the control signal ACT1 and the control signal ACT2 are configured as the first voltage.

During this stage, the source of each of the transistor N1 and the transistor N2 is grounded (GND). That is, the voltage received by the control signal NLAT1 and the control signal NLAT2 is 0.

In the exemplary embodiment of the present disclosure, whether the data in the memory cell on the first bitline BL or the data in the memory cell on the second bitline BLB is read may be determined based on a least-significant bit of a row address. For example, the least-significant bit A0 of the row address is an even address at a low level, and is an odd address at a high level. It may be specified that the even address after address decoding is to turn on the memory cell on the first bitline BL, and the odd address is to turn on the memory cell on the second bitline BLB. It is to be noted that the determination of the even address or the odd address is not limited to be recognized by the least-significant bit A0 of the row address. The determination of the even address or the odd address may also be recognized by other bit in the row address, or may further be recognized by a result that is obtained by processing at least one bit in the row address through a special relationship, which is not limited by the present disclosure, and may be independently set as required by those skilled in the art.

In a case of reading the data in the memory cell on the first bitline BL, in the second offset compensation stage of the sense amplifier, the switch K1, the switch K3 and the switch K6 are turned on, and the switch K2, the switch K4 and the switch K5 are turned off. In this case, considering that the switch K1 and the switch K3 are turned on, the transistor P1 and the transistor P2 are configured as a first current mirror structure. In the first current mirror structure, the transistor P1 is configured as a diode structure.

In the case of reading the data in the memory cell on the first bitline BL, in a first amplification stage of the sense amplifier, the control module is arranged to configure the amplification module as a third inverter.

During implementation, the transistor P2 and the transistor N2 may be controlled to be in a cut-off region, and the transistor P1 and the transistor N1 may be configured as the third inverter.

In this case, referring to FIG. 2, the sense amplifier of the present disclosure may further include a seventh switch (hereinafter referred to as a switch K7) and an eighth switch (hereinafter referred to as a switch K8). A first terminal of the switch K7 is connected to the first bitline BL, and a second terminal of the switch K7 is connected to the second node nR; and a first terminal of the switch K8 is connected to the second bitline BLB, and a second terminal of the switch K8 is connected to the first node nL.

Similarly, types of the switch K7 and the switch K8 are not limited by the present disclosure. For example, the switch K7 may be the PMOS transistor, NMOS transistor or CMOS transmission gate; and the switch K8 may be the PMOS transistor, NMOS transistor or CMOS transmission gate.

In some embodiments of the present disclosure, the switch K7 may include a control terminal, configured to control an on-off state of the switch K7 in response to an eighth control signal (recorded as a control signal CONBZ); and the switch K8 may also include a control terminal, configured to control an on-off state of the switch K8 in response to the control signal CONBZ. That is, the control terminal of each of the switch K7 and the switch K8 may receive the control signal CONBZ. However, it is to be understood that the switch K7 may also be different from the switch K8 in control signal, which is related with the types of the switch K7 and the switch K8, and is not limited by the present disclosure.

In the first offset compensation stage and the second offset compensation stage of the sense amplifier, the switch K7 and the switch K8 are turned off; and in the first amplification stage of the sense amplifier, the switch K1, the switch K4, the switch K5 and the switch K6 are turned off, and the switch K2, the switch K3, the switch K7 and the switch K8 are turned on.

In the case where the data in the memory cell on the first bitline BL is read, in the first amplification stage of the sense amplifier, the source of the transistor P1 receives the first voltage; the source of the transistor N1 is grounded; and the source of each of the transistor P2 and the transistor N2 receives a second voltage. The second voltage makes the transistor P2 and the transistor N2 to be in the cut-off region. The second voltage is less than the first voltage. In an embodiment, the second voltage may be VCC/2.

In a case of reading the data in the memory cell on the second bitline BLB, in the second offset compensation stage of the sense amplifier, the switch Kl, the switch K3 and the switch K6 are turned off, and the switch K2, the switch K4 and the switch K5 are turned on. In this case, considering that the switch K2 and the switch K4 are turned on, the transistor P1 and the transistor P2 are configured as a second current mirror structure. In the second current mirror structure, the transistor P2 is configured as a diode structure.

In the case of reading the data in the memory cell on the second bitline BLB, in the first amplification stage of the sense amplifier, the control module is arranged to configure the amplification module as a fourth inverter.

During implementation, the transistor P1 and the transistor N1 may be controlled to be in a cut-off region, and the transistor P2 and the transistor N2 may be configured as the fourth inverter.

Specifically, as mentioned above, the circuit configuration of the first amplification stage is implemented in combination with manners for configuring the switch K7 and the switch K8.

In the case of reading the data in the memory cell on the second bitline BLB, in the first amplification stage of the sense amplifier, the source of the transistor P2 receives the first voltage; the source of the transistor N2 is grounded; and the source of each of the transistor P1 and the transistor N1 receives the second voltage.

In the second amplification stage after the first amplification stage of the sense amplifier, the control module is further arranged to configure the amplification module as a cross-coupling amplification structure.

Specifically, in the second amplification stage, the switch K1, the switch K4, the switch K5 and the switch K6 are turned off, and the switch K2, the switch K3, the switch K7 and the switch K8 are turned on. Moreover, the source of each of the transistor P1 and the transistor P2 receives the first voltage, i.e., the control signal ACT1 and the control signal ACT2 are VCC. The source of each of the transistor N1 and the transistor N2 is grounded, i.e., the control signal NLAT1 and the control signal NLAT2 are 0.

In addition, in some embodiments, before the first offset compensation stage, the working stage of the sense amplifier may further include a pre-charging stage, during which the first bitline BL and the second bitline BLB are pre-charged.

In the pre-charging stage, in an embodiment, the switch K1 and the switch K4 are turned on, and the switch K2, the switch K3, the switch K5, the switch K6, the switch K7 and the switch K8 are turned off. In addition, the source of each of the transistor P1, the transistor P2, the transistor N1 and the transistor N2 receives the second voltage. However, it is to be understood that in the pre-charging stage, one or more of the switch K2, the switch K3, the switch K5, the switch K6, the switch K7 and the switch K8 may be in a turn-on state, and the switch K1 and the switch K4 may also be in a turn-off state, which is not limited by the present disclosure.

Figure 3:
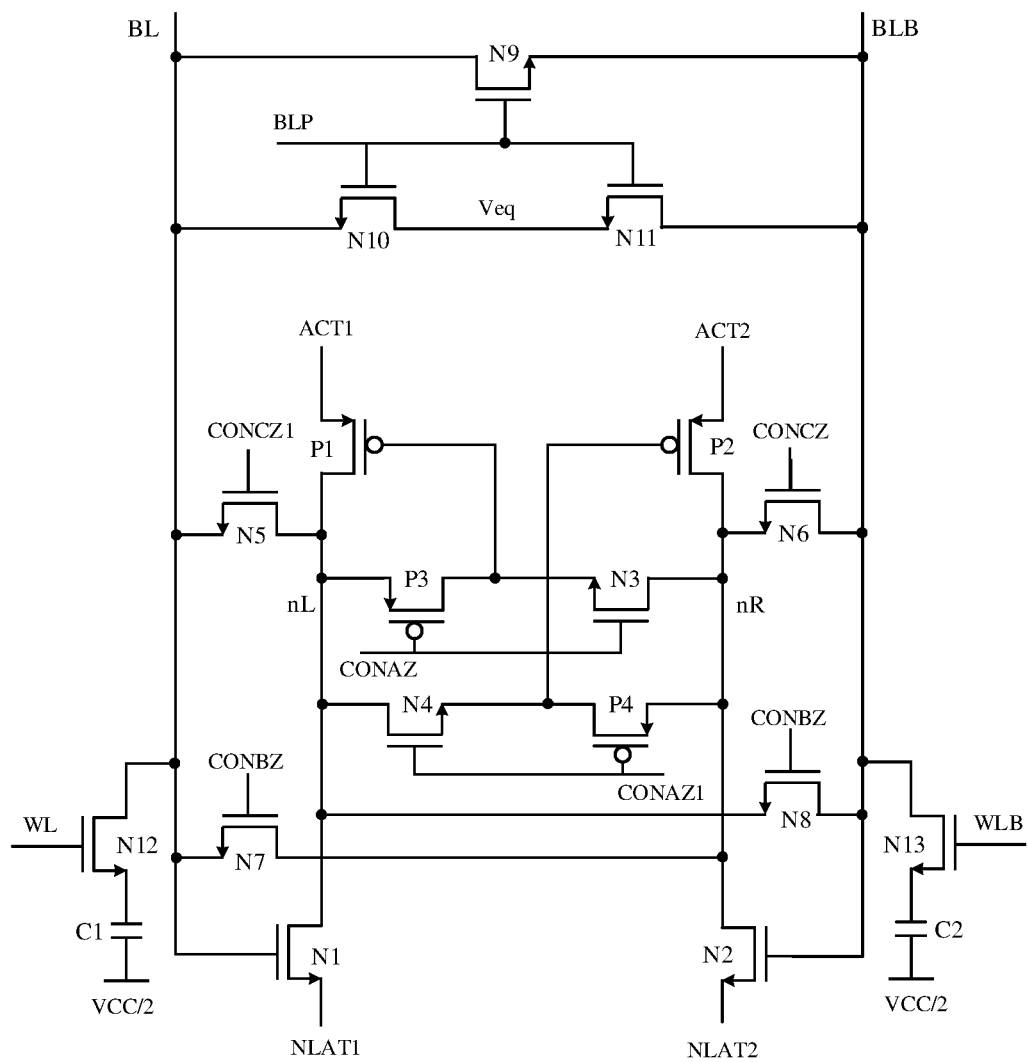
FIG. 3 schematically illustrates a circuit diagram of a specific configuration mode of a sense amplifier according to an embodiment of the present disclosure.

FIG. 3 schematically illustrates a circuit diagram of a sense amplifier according to an embodiment of the present disclosure.

In the embodiment illustrated in FIG. 3, the switch K1 is configured as a transistor P3, which controls an on-off state in response to the control signal CONAZ; the switch K2 is configured as a transistor N3, which controls an on-off state in response to the control signal CONAZ; the switch K3 is configured as a transistor N4, which controls an on-off state in response to the control signal CONAZ1; the switch K4 is configured as a transistor P4, which controls an on-off state in response to the control signal CONAZ1; the switch K5 is configured as a transistor N5, which controls an on-off state in response to the control signal CONCZ1; the switch K6 is configured as a transistor N6, which controls an on-off state in response to the control signal CONCZ; the switch K7 is configured as a transistor N7, which controls an on-off state in response to the control signal CONBZ; and the switch K8 is configured as a transistor N8, which controls an on-off state in response to the control signal CONBZ.

In the embodiment including the pre-charging module, the pre-charging module may include a transistor N9, a transistor N10 and a transistor N11.

A gate of each of the transistor N9, the transistor N10 and the transistor N11 may receive a pre-charging control signal BLP. A source of the transistor N9 is connected to the second bitline BLB, and a drain of the transistor N9 is connected to the first bitline BL; a source of the transistor N10 is connected to the first bitline BL, and a drain of the transistor N10 is connected to a source of the transistor N11, and connected to a pre-charging voltage Veq. The pre-charging voltage Veq may be configured as VCC/2. A drain of the transistor N11 is connected to the second bitline BLB.

The memory cell corresponding to the first bitline BL is configured to include a transistor N12 and a capacitor C1, and the transistor N12 controls an on-off state in response to a word line control signal WL; and the memory cell corresponding to the second bitline BLB is configured to include a transistor N13 and a capacitor C2, and the transistor N13 controls an on-off state in response to a word line control signal WLB.

The descriptions on the process of reading the data on the first bitline BL and the process of reading the data on the second bitline BLB will be made below.

Figure 4:
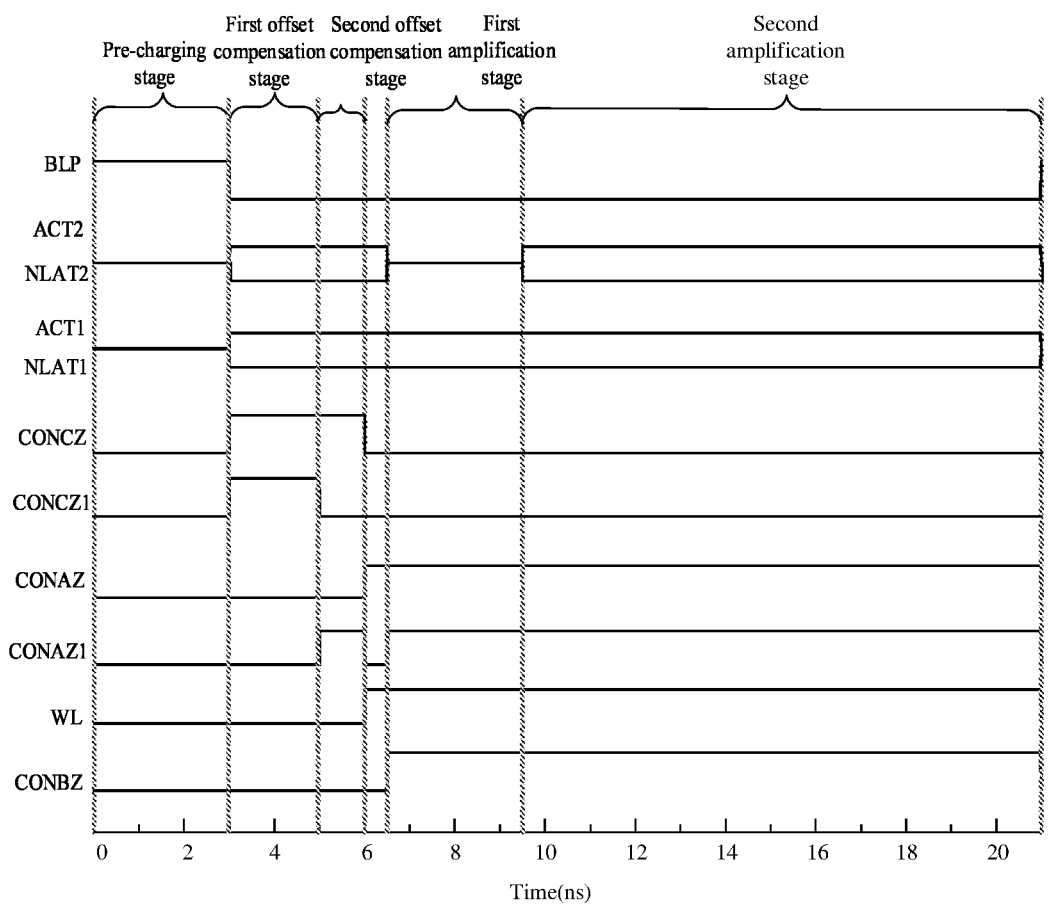
FIG. 4 schematically illustrates a sequence diagram of each control signal involved in a sense amplifier in a case of reading data in a memory cell on a first bitline according to an embodiment of the present disclosure.

FIG. 4 schematically illustrates a sequence diagram of each control signal involved in a sense amplifier in a case of reading data in a memory cell on a first bitline BL according to an embodiment of the present disclosure.

The working stage of the sense amplifier in a case of reading the data in the memory cell on the first bitline BL in the embodiment of the present disclosure will be described below in combination with the sequence diagram of FIG. 4.

Figure 5:
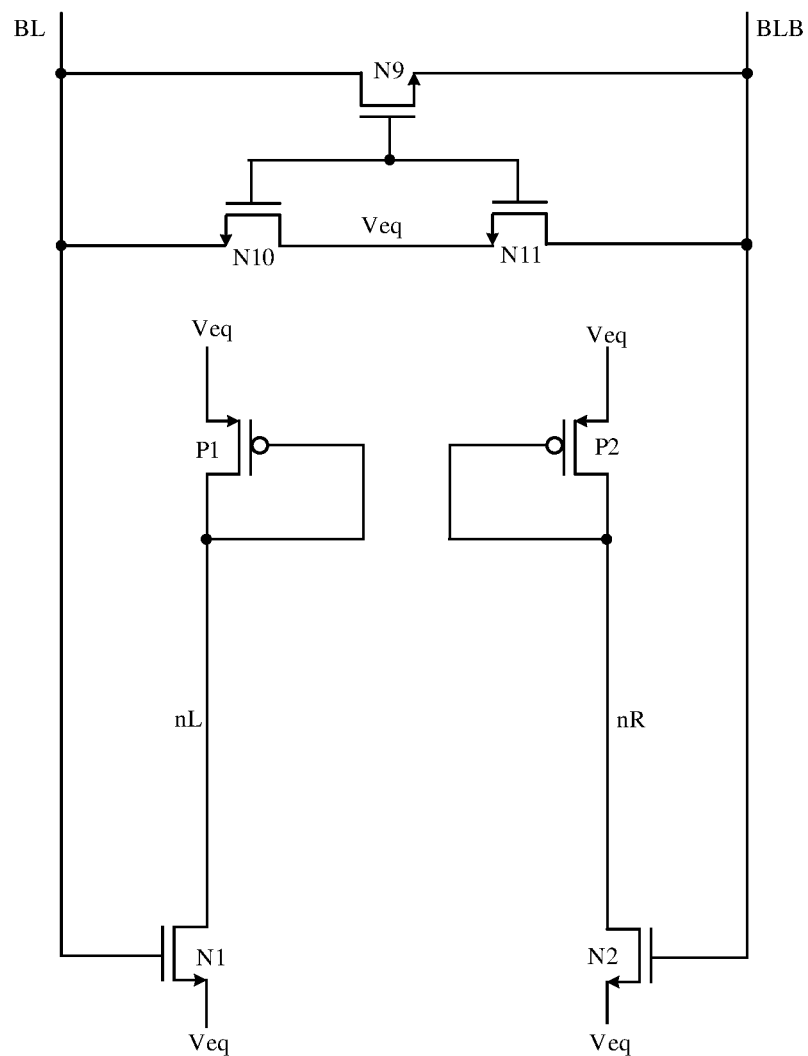
FIG. 5 schematically illustrates a circuit diagram of a sense amplifier in a pre-charging stage in a case of reading data in a memory cell on a first bitline according to an embodiment of the present disclosure.

FIG. 5 is directed to the pre-charging stage of the sense amplifier in a case of reading the data in the memory cell on the first bitline BL. Voltages of the pre-charging control signal BLP, the control signal ACT1, the control signal ACT2, the control signal NLAT1 and the control signal NLAT2 may be VCC, Veq, Veq, Veq and Veq, respectively. Correspondingly, the transistor N9, the transistor N10, and the transistor N11 are turned on (corresponding to the turn-on state of the switch). In this case, the first bitline BL and the second bitline BLB are respectively connected to the pre-charging voltage Veq through the transistor N10 and the transistor N11, and the first bitline BL and the second bitline BLB are connected to each other through the transistor N9, such that the first bitline BL and the second bitline BLB are pre-charged to the Veq.

Figure 6:
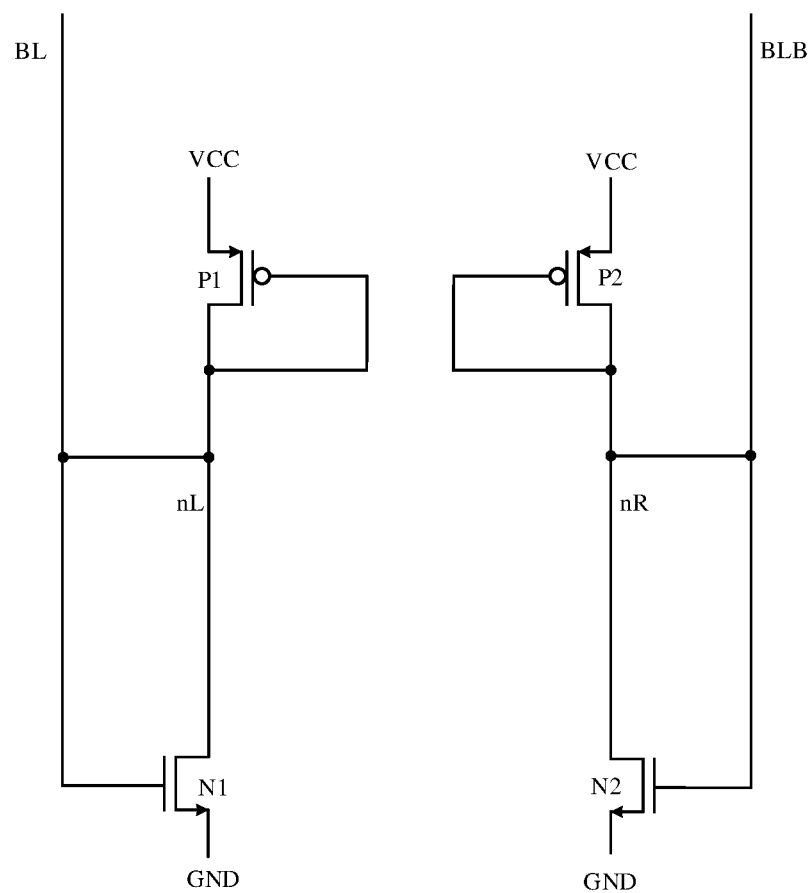
FIG. 6 schematically illustrates a circuit diagram of a sense amplifier in a first offset compensation stage in a case of reading data in a memory cell on a first bitline according to an embodiment of the present disclosure.

FIG. 6 is directed to the first offset compensation stage of the sense amplifier in a case of reading the data in the memory cell on the first bitline BL. Voltages of the control signal ACT1, the control signal NLAT1, the control signal ACT2, the control signal NLAT2, the control signal CONAZ, the control signal CONAZ1, the control signal CONCZ1, the control signal CONCZ, and the control signal CONBZ are VCC, 0 (ground GND), VCC, 0, 0, 0, VCC, VCC and 0, respectively. Correspondingly, the transistor P3, the transistor P4, the transistor N5 and the transistor N6 are turned on, and the transistor N3, the transistor N4, the transistor N7 and the transistor N8 are turned off (corresponding to the turn-off state of the switch).

In this case, the transistor P1 and the transistor N1 are configured as a first inverter with an input terminal and an output terminal connected to each other, and the transistor P2 and the transistor N2 are configured as a second inverter with an input terminal and an output terminal connected to each other. Therefore, the voltages on two terminals of the bitline may be stabilized to a turning point of the inverter.

Figure 7:
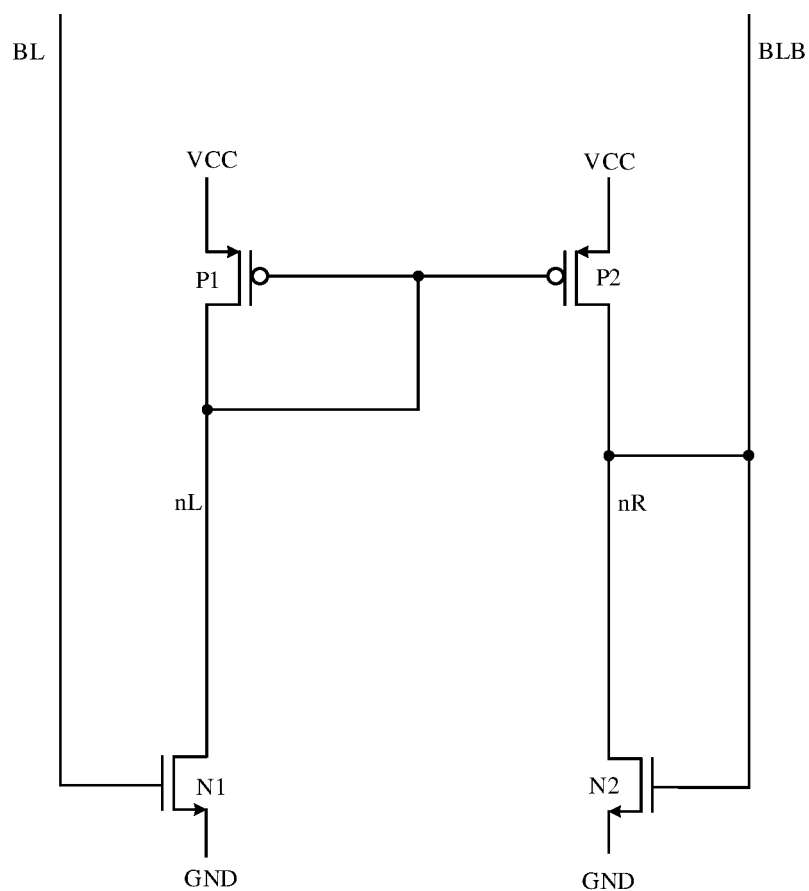
FIG. 7 schematically illustrates a circuit diagram of a sense amplifier in a second offset compensation stage in a case of reading data in a memory cell on a first bitline according to an embodiment of the present disclosure.

FIG. 7 is directed to the second offset compensation stage of the sense amplifier in a case of reading the data in the memory cell on the first bitline BL. Voltages of the control signal ACT1, the control signal NLAT1, the control signal ACT2, the control signal NLAT2, the control signal CONAZ, the control signal CONAZ1, the control signal CONCZ1, the control signal CONCZ, and the control signal CONBZ are VCC, 0, VCC, 0, 0, VCC, 0, VCC and 0, respectively. Correspondingly, the transistor P3, the transistor P4 and the transistor N6 are turned on, and the transistor N3, the transistor P4, the transistor N5, the transistor N7 and the transistor N8 are turned off.

In this case, the transistor P1 and the transistor P2 are formed into the first current mirror structure. In the first current mirror structure, the transistor P1 is configured as the diode structure. Therefore, the branch formed by the transistor P1 and the transistor N1 and the branch formed by the transistor P2 and the transistor N2 have equal currents, thereby compensating the voltage difference on the first bitline BL and the second bitline BLB.

Figure 8:
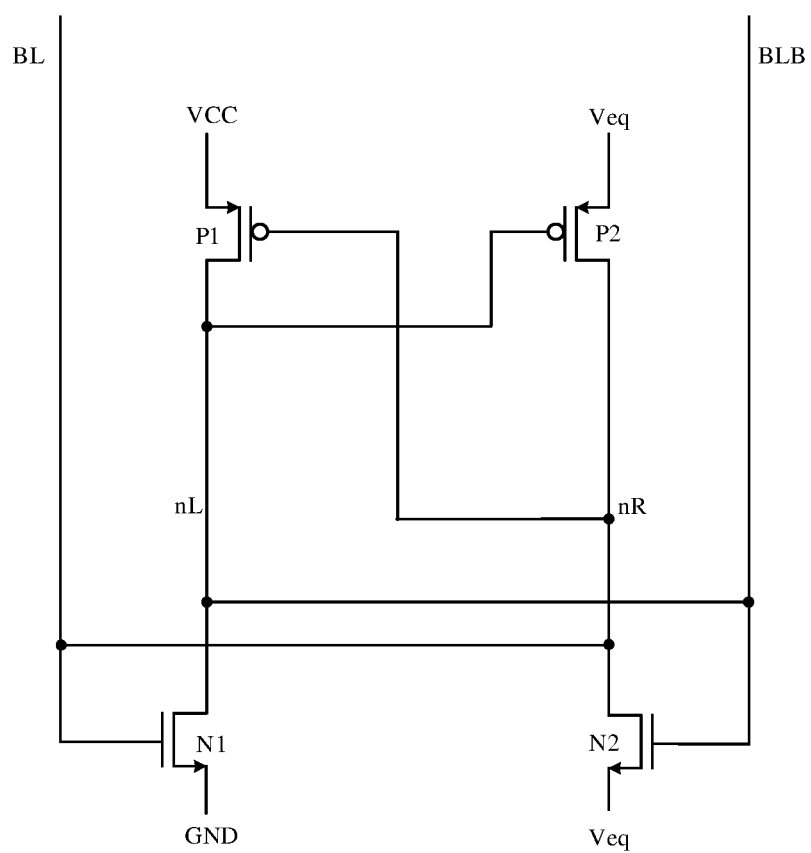
FIG. 8 schematically illustrates a circuit diagram of a sense amplifier in a first amplification stage in a case of reading data in a memory cell on a first bitline according to an embodiment of the present disclosure.

FIG. 8 is directed to the first amplification stage of the sense amplifier in a case of reading the data in the memory cell on the first bitline BL. Voltages of the control signal ACT1, the control signal NLAT1, the control signal ACT2, the control signal NLAT2, the control signal CONAZ, the control signal CONAZ1, the control signal CONCZ1, the control signal CONCZ, and the control signal CONBZ are VCC, 0, Veq, Veq, VCC, VCC, 0, 0 and VCC, respectively. Correspondingly, the transistor N3, the transistor N4, the transistor N7 and the transistor N8 are turned on, and the transistor P3, the transistor P4, the transistor N5 and the transistor N6 are turned off.

In this case, the transistor P1 and the transistor N1 are formed into one inverter. The input terminal of the inverter is the first bitline BL, and the output terminal of the inverter is the second bitline BLB. In addition, considering that the voltages of the control signal ACT2 and the control signal NLAT2 are Veq (VCC/2), the transistor P2 and the transistor N2 are in the cut-off region, that is, the transistor P2 and the transistor N2 are not in work.

If the sense amplifier reads 0 from the memory cell on the first bitline BL, the word line control signal WL is at the high level, and the voltage of the first bitline BL is less than that of the second bitline BLB, i.e., the input of the inverter composed of the transistor P1 and the transistor N1 is at the low level. Due to the function of the inverter, the voltage on the output terminal of the inverter rises continuously in the first amplification stage, i.e., the voltage of the second bitline BLB rises continuously.

If the sense amplifier reads 1 from the memory cell on the first bitline BL, the word line control signal WL is at the high level, and the voltage of the first bitline BL is higher than that of the second bitline BLB, i.e., the input of the inverter composed of the transistor P1 and the transistor N1 is at the high level. Due to the function of the inverter, the voltage on the output terminal of the inverter decreases continuously in the first amplification stage, i.e., the voltage of the second bitline BLB decreases continuously.

Therefore, in the first amplification stage of the sense amplifier in the present disclosure, the voltage difference between the first bitline BL and the second bitline BLB increases greatly, which is helpful for further amplification of the voltage difference between the first bitline BL and the second bitline BLB.

Figure 9:
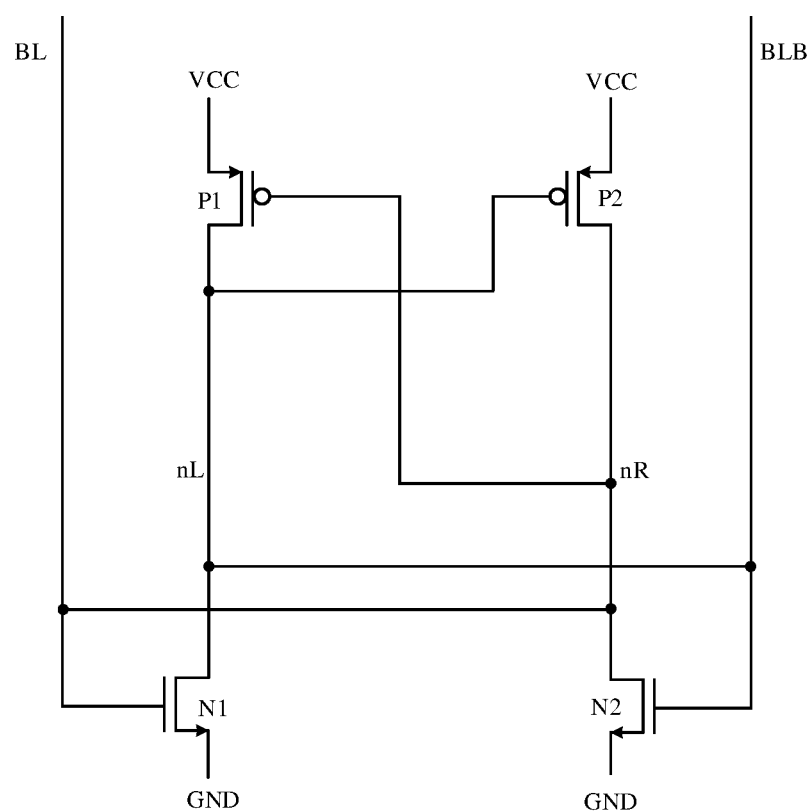
FIG. 9 schematically illustrates a circuit diagram of a sense amplifier in a second amplification stage in a case of reading data in a memory cell on a first bitline according to an embodiment of the present disclosure.

FIG. 9 is directed to the second amplification stage of the sense amplifier in a case of reading the data in the memory cell on the first bitline BL. Similar to the circuit connection state of the first amplification stage, the difference lies in that the voltages of the control signal ACT2 and the control signal NLAT2 are configured as VCC and 0, respectively.

If the sense amplifier reads 0 from the memory cell on the first bitline BL, the voltage on the first bitline BL is less than that on the second bitline BLB. In this case, the transistor N2 and the transistor N7 are turned on, and the voltage on the first bitline BL may be discharged to the ground through the transistor N2. In addition, the transistor P1 is turned on, and the voltage on the second bitline BLB rises to VCC.

If the sense amplifier reads 1 from the memory cell on the first bitline BL, the voltage on the first bitline BL is high than that on the second bitline BLB. In this case, the transistor N1 and the transistor N8 are turned on, and the voltage on the second bitline BLB may be discharged to the ground through the transistor N1. In addition, the transistor P2 is turned on, and the voltage on the first bitline BL rises to VCC.

Therefore, with such a cross-coupling amplification structure, the small voltage difference which is read from the memory cell by the bitline may be amplified to the full swing (0 or 1).

It is to be noted that a transitory stage may further be included between the second offset compensation stage and the first amplification stage. In the transitory stage, the word line is in a turn-on state, the control signal CONBZ is in a low state, and the transistor N7 and the transistor N8 are in the turn-off state, such that after the word line is turned on, electric charges in the memory cell are fully shared to the first bitline or the second bitline. However, the above case is not limited thereto, and may be set independently as required.

Figure 10:
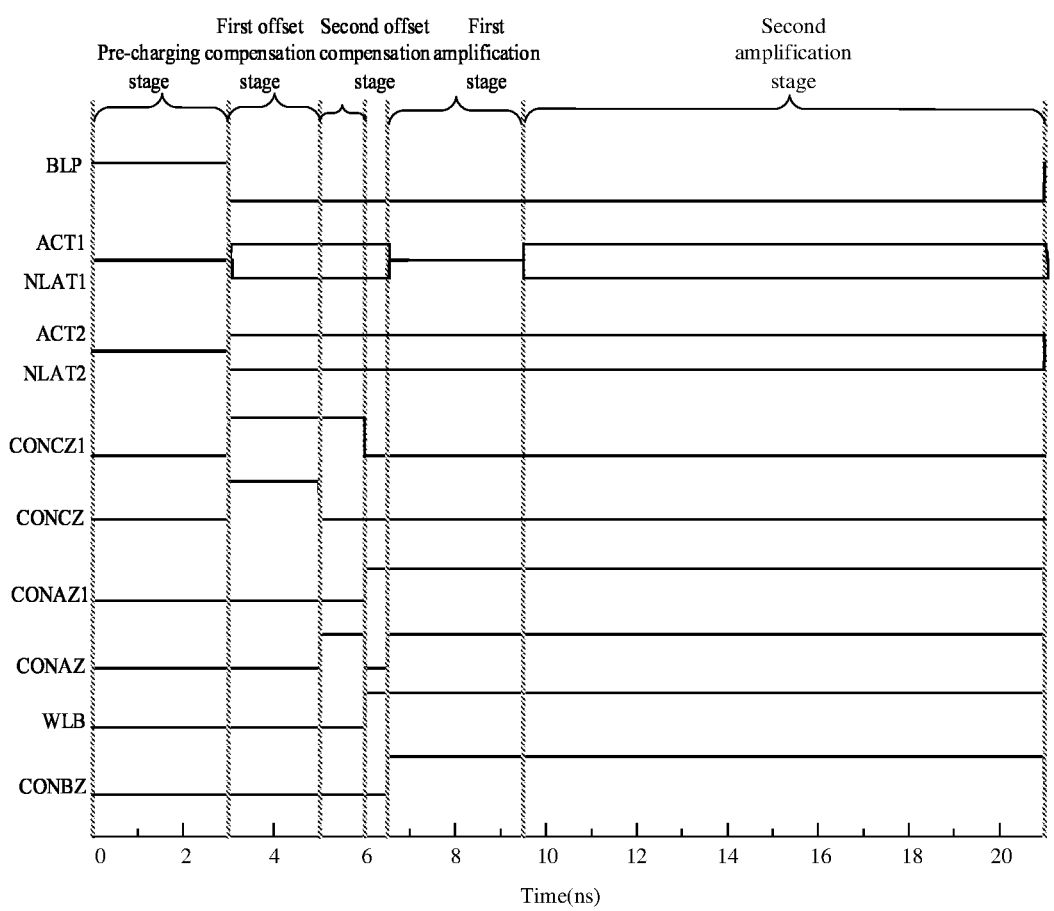
FIG. 10 schematically illustrates a sequence diagram of each control signal involved in a sense amplifier in a case of reading data in a memory cell on a second bitline according to an embodiment of the present disclosure.

FIG. 10 schematically illustrates a sequence diagram of each control signal involved in a sense amplifier in a case of reading data in a memory cell on a second bitline BLB according to an embodiment of the present disclosure.

The working stage of the sense amplifier in a case of reading the data in the memory cell on the second bitline BLB in the embodiment of the present disclosure will be described below in combination with the sequence diagram of FIG. 10.

Figure 11:
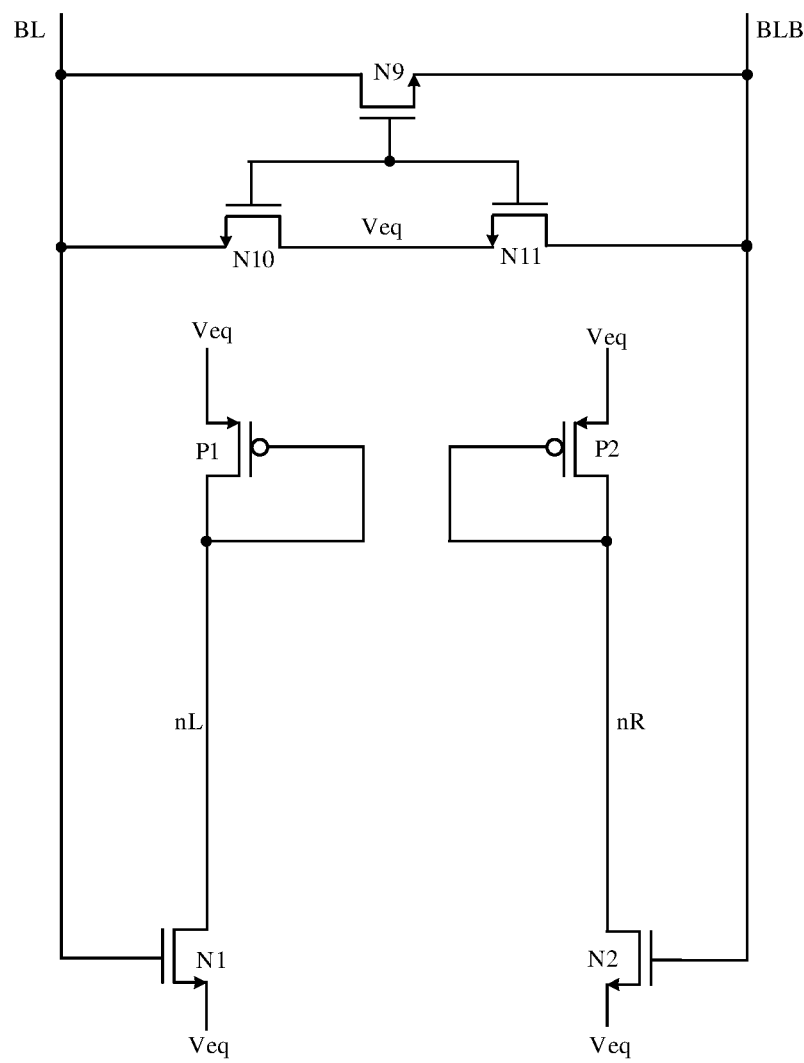
FIG. 11 schematically illustrates a circuit diagram of a sense amplifier in a pre-charging stage in a case of reading data in a memory cell on a second bitline according to an embodiment of the present disclosure.

FIG. 11 is directed to the pre-charging stage of the sense amplifier in a case of reading the data in the memory cell on the second bitline BLB. The pre-charging process is the same as the above-described process of FIG. 5, and will not be repeated. In addition, it is to be noted that no matter whether the first bitline BL or the second bitline BLB is read, the pre-charging stage may not exist.

Figure 12:
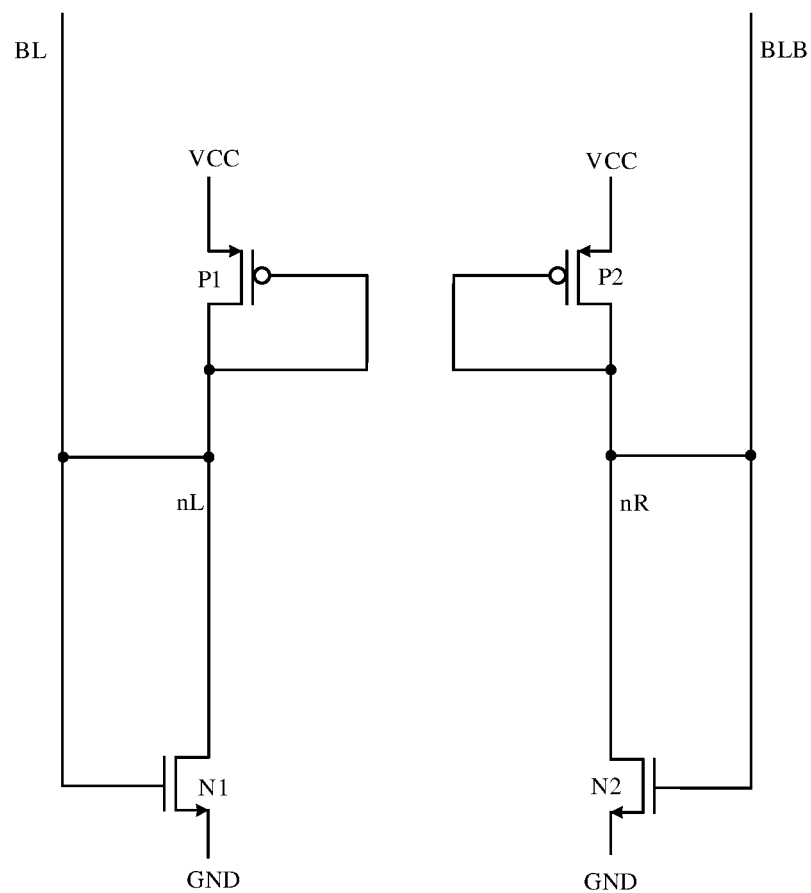
FIG. 12 schematically illustrates a circuit diagram of a sense amplifier in a first offset compensation stage in a case of reading data in a memory cell on a second bitline according to an embodiment of the present disclosure.

FIG. 12 is directed to the first offset compensation stage of the sense amplifier in a case of reading the data in the memory cell on the second bitline BL. The process is the same as the above-described process of FIG. 6, and will not be repeated.

Figure 13:
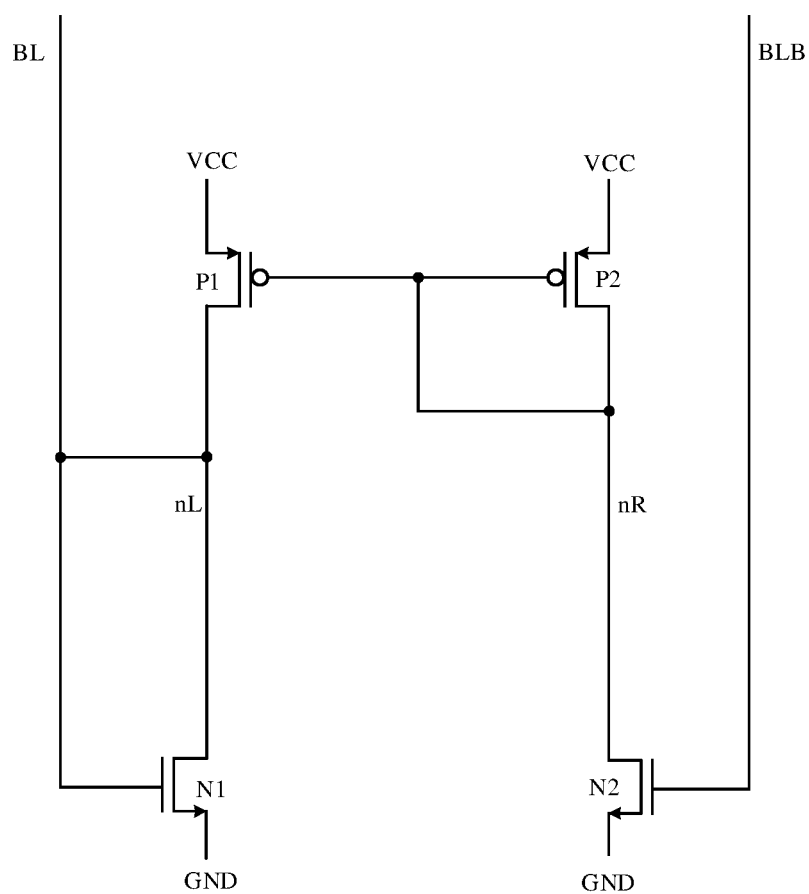
FIG. 13 schematically illustrates a circuit diagram of a sense amplifier in a second offset compensation stage in a case of reading data in a memory cell on a second bitline according to an embodiment of the present disclosure.

FIG. 13 is directed to the second offset compensation stage of the sense amplifier in a case of reading the data in the memory cell on the second bitline BL. Voltages of the control signal ACT1, the control signal NLAT1, the control signal ACT2, the control signal NLAT2, the control signal CONAZ, the control signal CONAZ1, the control signal CONCZ1, the control signal CONCZ, and the control signal CONBZ are VCC, 0, VCC, 0, VCC, 0, VCC, 0 and 0, respectively. Correspondingly, the transistor N3, the transistor P4 and the transistor N5 are turned on, and the transistor P3, the transistor N4, the transistor N6, the transistor N7 and the transistor N8 are turned off.

In this case, the transistor P1 and the transistor P2 are formed into the second current mirror structure. In the second current mirror structure, the transistor P2 is configured as the diode structure. Therefore, the branch formed by the transistor P1 and the transistor N1 and the branch formed by the transistor P2 and the transistor N2 have equal currents, thereby compensating the voltage difference on the first bitline BL and the second bitline BLB.

Figure 14:
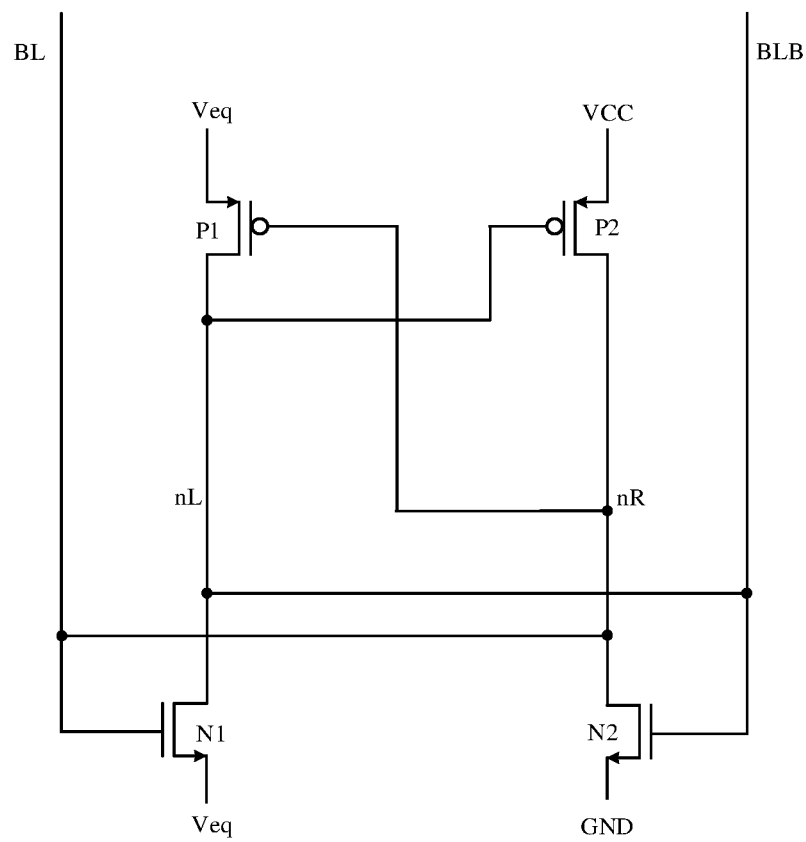
FIG. 14 schematically illustrates a circuit diagram of a sense amplifier in a first amplification stage in a case of reading data in a memory cell on a second bitline according to an embodiment of the present disclosure.

FIG. 14 is directed to the first amplification stage of the sense amplifier in a case of reading the data in the memory cell on the second bitline BL. Voltages of the control signal ACT1, the control signal NLAT1, the control signal ACT2, the control signal NLAT2, the control signal CONAZ, the control signal CONAZ1, the control signal CONCZ1, the control signal CONCZ, and the control signal CONBZ are Veq, Veq, VCC, 0, VCC, VCC, 0, 0 and VCC, respectively. Correspondingly, the transistor N3, the transistor N4, the transistor N7 and the transistor N8 are turned on, and the transistor P3, the transistor P4, the transistor N5 and the transistor N6 are turned off.

In this case, the transistor P2 and the transistor N2 are formed into one inverter. The input terminal of the inverter is the second bitline BLB, and the output terminal of the inverter is the first bitline BL. In addition, considering that the voltages of the control signal ACT1 and the control signal NLAT1 are Veq (VCC/2), the transistor P1 and the transistor N1 are in the cut-off region, that is, the transistor P1 and the transistor N1 are not in work.

If the sense amplifier reads 0 from the memory cell on the second bitline BLB, the word line control signal WLB is at the high level, and the voltage of the second bitline BLB is less than that of the first bitline BL, i.e., the input of the inverter composed of the transistor P2 and the transistor N2 is at the low level. Due to the function of the inverter, the voltage on the output terminal of the inverter rises continuously in the first amplification stage, i.e., the voltage of the first bitline BL rises continuously.

If the sense amplifier reads 1 from the memory cell on the second bitline BLB, the word line control signal WLB is at the high level, and the voltage of the second bitline BLB is higher than that of the first bitline BL, i.e., the input of the inverter composed of the transistor P2 and the transistor N2 is at the high level. Due to the function of the inverter, the voltage on the output terminal of the inverter decreases continuously in the first amplification stage, i.e., the voltage of the first bitline BL decreases continuously.

Therefore, in the first amplification stage of the sense amplifier in the present disclosure, the voltage difference between the first bitline BL and the second bitline BLB increases greatly, which is helpful for further amplification of the voltage difference between the first bitline BL and the second bitline BLB.

Figure 15:
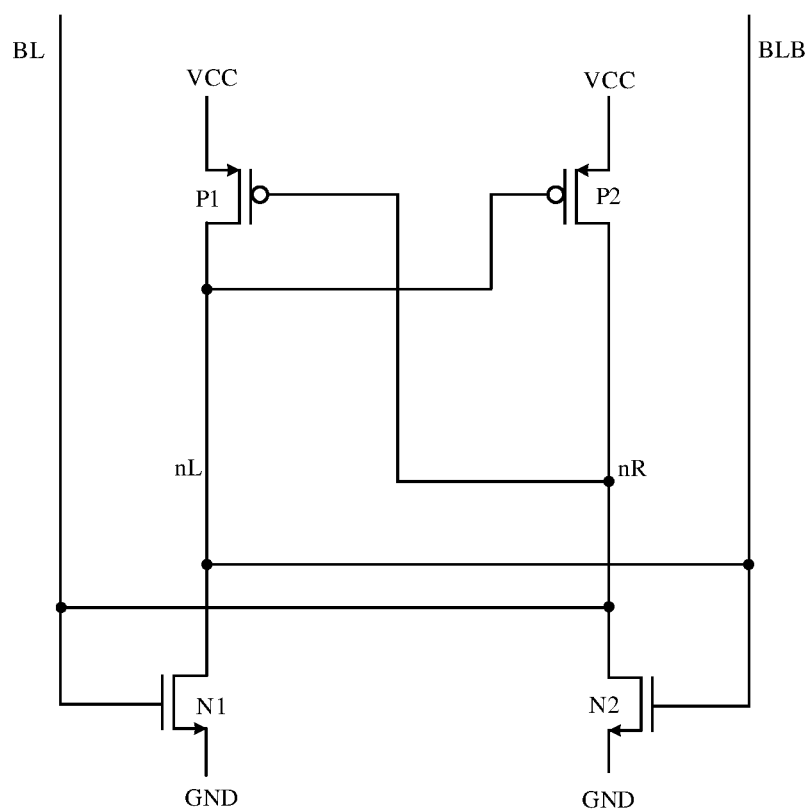
FIG. 15 schematically illustrates a circuit diagram of a sense amplifier in a second amplification stage in a case of reading data in a memory cell on a second bitline according to an embodiment of the present disclosure.

FIG. 15 is directed to the second amplification stage of the sense amplifier in a case of reading the data in the memory cell on the second bitline BL. The second amplification stage of FIG. 15 is the same as the above-described process of FIG. 9, and will not be repeated.

It is to be noted that a transitory stage may further be included between the second offset compensation stage and the first amplification stage. In the transitory stage, the word line is in a turn-on state, the control signal CONBZ is in a low state, and the transistor N7 and the transistor N8 are in the turn-off state, such that after the word line is turned on, electric charges in the memory cell are fully shared to the first bitline or the second bitline. However, the above case is not limited thereto, and may be set independently as required.

Further, the present disclosure further provides a method for controlling a sense amplifier.

Figure 16:
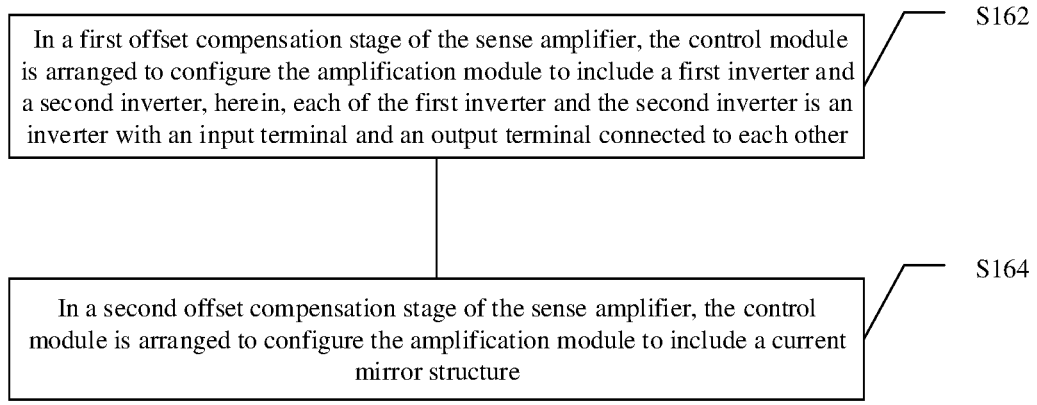
FIG. 16 schematically illustrates a flowchart of a method for controlling a sense amplifier according to an exemplary embodiment of the present disclosure.

FIG. 16 schematically illustrates a flowchart of a method for controlling a sense amplifier according to an exemplary embodiment of the present disclosure. As mentioned above, the sense amplifier may include an amplification module and a control module.

Referring to FIG. 16, the method for controlling the sense amplifier may include the following operations.

In S162, in a first offset compensation stage of the sense amplifier, the control module is arranged to configure the amplification module to include a first inverter and a second inverter, herein, each of the first inverter and the second inverter is an inverter with an input terminal and an output terminal connected to each other.

In S164, in a second offset compensation stage of the sense amplifier, the control module is arranged to configure the amplification module to include a current mirror structure.

According to the exemplary embodiment of the present disclosure, in a case of reading data in a memory cell on a first bitline, in a first amplification stage of the sense amplifier, the amplification module is configured as a third inverter by the control module; and in a case of reading data in a memory cell on a second bitline, in the first amplification stage of the sense amplifier, the amplification module is configured as a fourth inverter by the control module.

According to the exemplary embodiment of the present disclosure, in a second amplification stage after the first amplification stage of the sense amplifier, the amplification module is configured as a cross-coupling amplification structure by the control module.

In some embodiments of the present disclosure, the sense amplifier may further include a pre-charging stage. However, it is to be understood that the pre-charging stage is unnecessarily to the solutions of the present disclosure.

Details on these stages have been described in the above process of configuring the sense amplifier, and will not be repeated herein.

With the method for controlling the sense amplifier in the exemplary embodiment of the present disclosure, voltages of bitlines on two sides of the sense amplifier may be adjusted according to different data read on the first bitline and the second bitline, so as to compensate the influence on the voltages of the bitlines on the two sides of the sense amplifier due to the offset noise, thereby improving the performance of the semiconductor memory.

Further, the present disclosure further provides a memory. The memory may include the above-mentioned sense amplifier.

The memory in the exemplary embodiment of the present disclosure implements the offset compensation well and has a low reading error rate, so that the performance of the memory is greatly improved.

Other embodiments of the present disclosure will be apparent to those skilled in the art from consideration of the specification and practice of the present disclosure. The present disclosure is intended to cover any variations, uses, or adaptations of the above disclosures following the general principles thereof and including such departures from the present disclosure as come within known or customary practice in the art. The specification and examples are considered as exemplary only, with a true scope and spirit of the present disclosure being indicated by the claims.

It will be appreciated that the present disclosure is not limited to the exact construction that has been described above and illustrated in the accompanying drawings, and that various modifications and changes may be made without departing from the scope thereof. The scope of the present disclosure is only limited by the appended claims.

The invention claimed is:

1. A sense amplifier, comprising:
an amplification circuit, arranged to read data in a memory cell and comprising a plurality of transistors; and
a control circuit, electrically connected to the amplification circuit and comprising a plurality of switches,
wherein in a first offset compensation stage of the sense amplifier, the control circuit is arranged to control, through controlling on-off states of the plurality of switches by receiving at least one control signal, the plurality of transistors of the amplification circuit to form a first inverter and a second inverter, each of the first inverter and the second inverter being an inverter with an input terminal and an output terminal connected to each other; and
in a second offset compensation stage of the sense amplifier, the control circuit is arranged to control, through controlling the on-off states of the plurality of switches by receiving the at least one control signal, a first part of the plurality of transistors of the amplification circuit to form a current mirror structure,
wherein the plurality of transistors of the amplification circuit comprise:
a first P-channel Metal Oxide Semiconductor (PMOS) transistor;
a second PMOS transistor;
a first N-channel Metal Oxide Semiconductor (NMOS) transistor, a gate of the first NMOS transistor being connected to a first bitline, and a drain of the first NMOS transistor being connected to a drain of the first PMOS transistor through a first node; and
a second NMOS transistor, a gate of the second NMOS transistor being connected to a second bitline, and a drain of the second NMOS transistor being connected to a drain of the second PMOS transistor through a second node,
wherein in the first offset compensation stage of the sense amplifier, the first PMOS transistor and the first NMOS transistor are configured as the first inverter, and the second PMOS transistor and the second NMOS transistor are configured as the second inverter.

2. The sense amplifier of claim 1, wherein the plurality of switches of the control circuit comprise:
a first switch, a first terminal of the first switch being connected to the first node, and a second terminal of the first switch being connected to a gate of the first PMOS transistor;
a second switch, a first terminal of the second switch being connected to the gate of the first PMOS transistor, and a second terminal of the second switch being connected to the second node;
a third switch, a first terminal of the third switch being connected to a gate of the second PMOS transistor, and a second terminal of the third switch being connected to the first node;
a fourth switch, a first terminal of the fourth switch being connected to the second node, and a second terminal of the fourth switch being connected to the gate of the second PMOS transistor;
a fifth switch, a first terminal of the fifth switch being connected to the first bitline, and a second terminal of the fifth switch being connected to the first node; and
a sixth switch, a first terminal of the sixth switch being connected to the second bitline, and a second terminal of the sixth switch being connected to the second node,
wherein in the first offset compensation stage of the sense amplifier, the first switch, the fourth switch, the fifth switch and the sixth switch are turned on, and the second switch and the third switch are turned off.

3. The sense amplifier of claim 2, wherein in the first offset compensation stage of the sense amplifier, a source of each of the first PMOS transistor and the second PMOS transistor receives a first voltage, and a source of each of the first NMOS transistor and the second NMOS transistor is grounded.

4. The sense amplifier of claim 3, wherein in a case of reading the data in the memory cell on the first bitline, in the second offset compensation stage of the sense amplifier, the first switch, the third switch and the sixth switch are turned on, and the second switch, the fourth switch and the fifth switch are turned off,
wherein in a case that the first switch and the third switch are turned on, the first PMOS transistor and the second PMOS transistor are configured as a first current mirror structure.

5. The sense amplifier of claim 3, wherein in a case of reading the data in the memory cell on the second bitline, in the second offset compensation stage of the sense amplifier, the first switch, the third switch and the sixth switch are turned off, and the second switch, the fourth switch and the fifth switch are turned on,
wherein in a case that the second switch and the fourth switch are turned on, the first PMOS transistor and the second PMOS transistor are configured as a second current mirror structure.

6. The sense amplifier of claim 4, wherein in the case of reading the data in the memory cell on the first bitline, in a first amplification stage of the sense amplifier, the control circuit is arranged to control, through controlling the on-off states of the plurality of switches by receiving the at least one control signal, a second part of the plurality of transistors of the amplification circuit to form a third inverter.

7. The sense amplifier of claim 6, wherein in the case of reading the data in the memory cell on the first bitline, in the first amplification stage of the sense amplifier, the second PMOS transistor and the second NMOS transistor are controlled to be in a cut-off region, and the first PMOS transistor and the first NMOS transistor are configured to form the third inverter.

8. The sense amplifier of claim 5, wherein in the case of reading the data in the memory cell on the second bitline, in a first amplification stage of the sense amplifier, the control circuit is arranged to control, through controlling the on-off states of the plurality of switches by receiving the at least one control signal, a second part of the plurality of transistors of the amplification circuit to form a fourth inverter.

9. The sense amplifier of claim 8, wherein in the case of reading the data in the memory cell on the second bitline, in the first amplification stage of the sense amplifier, the first PMOS transistor and the first NMOS transistor are controlled to be in a cut-off region, and the second PMOS transistor and the second NMOS transistor are configured to form the fourth inverter.

10. The sense amplifier of claim 6, wherein the plurality of switches of the control circuit further comprise:
a seventh switch, a first terminal of the seventh switch being connected to the first bitline, and a second terminal of the seventh switch being connected to the second node; and
an eighth switch, a first terminal of the eighth switch being connected to the second bitline, and a second terminal of the eighth switch being connected to the first node,
wherein in the first offset compensation stage and the second offset compensation stage of the sense amplifier, the seventh switch and the eighth switch are turned off; and
in the first amplification stage of the sense amplifier, the first switch, the fourth switch, the fifth switch and the sixth switch are turned off, and the second switch, the third switch, the seventh switch and the eighth switch are turned on.

11. The sense amplifier of claim 7, wherein in the case of reading the data in the memory cell on the first bitline, in the first amplification stage of the sense amplifier, the source of the first PMOS transistor receives the first voltage, the source of the first NMOS transistor is grounded, and the source of the second PMOS transistor and the source of the second NMOS transistor receive a second voltage,
wherein the second voltage is less than the first voltage.

12. The sense amplifier of claim 9, wherein in the case of reading the data in the memory cell on the second bitline, in the first amplification stage of the sense amplifier, the source of the second PMOS transistor receives the first voltage, the source of the second NMOS transistor is grounded, and the source of the first PMOS transistor and the source of the first NMOS transistor receive a second voltage,
wherein the second voltage is less than the first voltage.

13. The sense amplifier of claim 10, wherein in a second amplification stage after the first amplification stage of the sense amplifier, the control circuit is arranged to control, through controlling the on-off states of the plurality of switches by receiving the at least one control signal, the plurality of transistors of the amplification circuit to form a cross-coupling amplification structure.

14. The sense amplifier of claim 13, wherein in the second amplification stage of the sense amplifier, the first switch, the fourth switch, the fifth switch and the sixth switch are turned off, and the second switch, the third switch, the seventh switch and the eighth switch are turned on.

15. The sense amplifier of claim 14, wherein in the second amplification stage of the sense amplifier, the source of each of the first PMOS transistor and the second PMOS transistor receives the first voltage, and the source of each of the first NMOS transistor and the second NMOS transistor is grounded.

16. The sense amplifier of claim 15, further comprising:
a pre-charging circuit, arranged to pre-charge the first bitline and the second bitline in a pre-charging stage before the first offset compensation stage of the sense amplifier.

17. A memory, comprising a sense amplifier, the sense amplifier comprising:
an amplification circuit, arranged to read data in a memory cell and comprising a plurality of transistors; and
a control circuit, electrically connected to the amplification circuit and comprising a plurality of switches,
wherein in a first offset compensation stage of the sense amplifier, the control circuit is arranged to control, through controlling on-off states of the plurality of switches by receiving at least one control signal, the plurality of transistors of the amplification circuit to form a first inverter and a second inverter, each of the first inverter and the second inverter being an inverter with an input terminal and an output terminal connected to each other; and
in a second offset compensation stage of the sense amplifier, the control circuit is arranged to control, through controlling the on-off states of the plurality of switches by receiving the at least one control signal, a first part of the plurality of transistors of the amplification circuit to form a current mirror structure,
wherein the plurality of transistors of the amplification circuit comprise:
a first P-channel Metal Oxide Semiconductor (PMOS) transistor;
a second PMOS transistor;
a first N-channel Metal Oxide Semiconductor (NMOS) transistor, a gate of the first NMOS transistor being connected to a first bitline, and a drain of the first NMOS transistor being connected to a drain of the first PMOS transistor through a first node; and
a second NMOS transistor, a gate of the second NMOS transistor being connected to a second bitline, and a drain of the second NMOS transistor being connected to a drain of the second PMOS transistor through a second node,
wherein in the first offset compensation stage of the sense amplifier, the first PMOS transistor and the first NMOS transistor are configured as the first inverter, and the second PMOS transistor and the second NMOS transistor are configured as the second inverter.

18. A method for controlling a sense amplifier, the sense amplifier comprising an amplification circuit and a control circuit electrically connected to the amplification circuit, the amplification circuit comprising a plurality of transistors and the control circuit comprising a plurality of switches, and the method for controlling the sense amplifier comprising:
in a first offset compensation stage of the sense amplifier, controlling, by the control circuit, through controlling on-off states of the plurality of switches by receiving at least one control signal, the plurality of transistors of the amplification circuit to form a first inverter and a second inverter, each of the first inverter and the second inverter being an inverter with an input terminal and an output terminal connected to each other;
in a second offset compensation stage of the sense amplifier, controlling, by the control circuit, through controlling the on-off states of the plurality of switches by receiving the at least one control signal, a first part of the plurality of transistors of the amplification circuit to form a current mirror structure;
in a case of reading data in a memory cell on a first bitline, in a first amplification stage of the sense amplifier, controlling, by the control circuit, through controlling the on-off states of the plurality of switches by receiving the at least one control signal, a second part of the plurality of transistors of the amplification circuit to form a third inverter; and
in a case of reading data in a memory cell on a second bitline, in the first amplification stage of the sense amplifier, controlling, by the control circuit, through controlling the on-off states of the plurality of switches by receiving the at least one control signal, a third part of the plurality of transistors of the amplification circuit to form a fourth inverter.

* * * * *